US009749752B2

(12) United States Patent
Yoo

(10) Patent No.: US 9,749,752 B2

(45) Date of Patent: *Aug. 29, 2017

(54) MICROPHONE AND METHOD OF MANUFACTURING THE SAME

(71) Applicant: HYUNDAI MOTOR COMPANY, Seoul (KR)

(72) Inventor: Ilseon Yoo, Seoul (KR)

(73) Assignee: HYUNDAI MOTOR COMPANY, Seoul (KR)

(*) Notice: Subject to any disclaimer, the term of this patent is extended or adjusted under 35 U.S.C. 154(b) by 43 days.

This patent is subject to a terminal disclaimer.

(21) Appl. No.: 14/883,527

(22) Filed: Oct. 14, 2015

(65) Prior Publication Data

US 2016/0150324 A1 May 26, 2016

(30) Foreign Application Priority Data

Nov. 26, 2014 (KR) ........................ 10-2014-0166783

(51) Int. Cl.

*H01L 21/00* (2006.01)
*H04R 19/04* (2006.01)
*H04R 19/00* (2006.01)
*H04R 1/34* (2006.01)
*H04R 31/00* (2006.01)

(52) U.S. Cl.

CPC ............. *H04R 19/04* (2013.01); *H04R 31/00* (2013.01); *H04R 1/342* (2013.01); *H04R 19/005* (2013.01); *H04R 31/003* (2013.01); *H04R 2201/003* (2013.01)

(58) Field of Classification Search

None

See application file for complete search history.

(56) References Cited

U.S. PATENT DOCUMENTS 8,467,548 B2 6/2013 Karunasiri et al.
8,541,852 B2 * 9/2013 Kasai ..................... G01H 11/06 257/415
2003/0118203 A1 * 6/2003 Raicevich .............. H04R 19/00 381/174
2007/0201710 A1 * 8/2007 Suzuki .................. B81B 3/0072 381/174
2009/0161894 A1 6/2009 Kimura (Continued)

FOREIGN PATENT DOCUMENTS

JP 2014-90512 A 5/2014
KR 1020050093267 A 9/2005

(Continued)

*Primary Examiner* — Angel Roman

(74) *Attorney, Agent, or Firm* — McDermott Will & Emery LLP

(57) ABSTRACT

A microphone includes: a first substrate having one or more first penetration holes; a vibrating membrane disposed on the first substrate and covering the first penetration holes; a fixed membrane disposed at a predetermined distance over the vibration membrane and having a plurality of air intake holes; and a phase delay unit bonded by a bonding pad on the fixed membrane, having a plurality of second penetration holes connected to the one or more first penetration holes, and having a phase delay material in the second penetration holes. A method of manufacturing a microphone including a phase delay unit is also disclosed.

20 Claims, 19 Drawing Sheets

(56) References Cited

U.S. PATENT DOCUMENTS

| | | | | |
|---|---|---|---|---|
| 2010/0022046 | A1* | 1/2010 | Utsumi | B81C 1/00896 438/51 |
| 2011/0075865 | A1* | 3/2011 | Yang | H04R 19/005 381/174 |
| 2015/0060955 | A1* | 3/2015 | Chen | H04R 19/005 257/254 |
| 2016/0150326 | A1* | 5/2016 | Yoo | H04R 31/00 381/174 |

FOREIGN PATENT DOCUMENTS

| | | | |
|---|---|---|---|
| KR | 10-0640199 | B1 | 11/2006 |
| KR | 10-0740462 | B1 | 7/2007 |
| KR | 10-2007-0115035 | A | 12/2007 |
| KR | 10-1089828 | B1 | 12/2011 |

* cited by examiner

100

MICROPHONE AND METHOD OF MANUFACTURING THE SAME

CROSS-REFERENCE TO RELATED APPLICATION

This application claims the benefit of priority to Korean Patent Application No. 10-2014-0166783 filed in the Korean Intellectual Property Office on Nov. 26, 2014, the entire contents of which are incorporated herein by reference.

TECHNICAL FIELD

The present invention relates to a microphone and a method of manufacturing the microphone. More particularly, the present invention relates to a microphone of which sensitivity is improved by delaying a phase of sound input from the outside, and a method of manufacturing the microphone.

BACKGROUND

In general, microphones, which convert sound into an electric signal, have been recently increasingly downsized, and accordingly, a microphone using a MEMS (Micro Electro Mechanical System) has been developed.

Such a MEMS resists humidity and heat, as compared with ECMs (Electret Condenser Microphones) of the related art, and downsizing and integrating with a signal process circuit are possible.

Two known types of MEMS microphones are a capacitive MEMS microphone and a piezoelectric MEMS microphone.

A capacitive MEMS microphone generally includes a fixed membrane and a diaphragm, so when a sound pressure is applied from the outside, the gap between the fixed membrane and the diaphragm changes and the capacitance accordingly changes.

The sound pressure is measured on the basis of an electrical signal generated in this process.

On the other hand, a piezoelectric MEMS microphone includes only a vibrating membrane, in which when the vibrating membrane is deformed by external sound pressure, and an electrical signal is generated by a piezoelectric effect, thereby measuring sound pressure.

MEMS microphones can be classified into a non-directional (omnidirectional) microphone and a directional microphone in accordance with the directional characteristic, and directional microphones can be classified into a bidirectional microphone and a unidirectional microphone.

The bid-directional microphone receives sounds from both the front and back, but attenuates sounds from sides, so it has a ribbon polar pattern for sound.

Further, the bidirectional microphone has a good near field effect, so it is generally used by announcers at stadiums with a lot of noise.

On the other hand, the unidirectional microphone maintains output in response to sound from a wide area, but offsets output for sound from the back, thereby improving the S/N ratio, and accordingly, it produces clear sound and is generally used for equipment for recognizing voice.

However, the price of the directional MEMS microphones is increased by over double due to requirement of two or more digital MEMS microphones and DSP (Digital Signal Processing) chips.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a microphone that can be downsized by a phase delay membrane made of a wafer level package, can have more precise directionality, and can be more easily manufactured, and a method of manufacturing the microphone.

An exemplary embodiment of the present invention provides a method of manufacturing a microphone which includes: preparing a first substrate having first and second opposing surfaces and then forming a vibrating membrane having an oxide film and a plurality of slots on the first opposing surface of the first substrate; forming a sacrificial layer and a fixed membrane, each having first and second opposing surfaces, over the vibrating membrane and then forming a plurality of air intake holes through the fixed membrane; depositing a first pad to be connected with the fixed membrane, a second pad to be connected with the vibrating membrane, and a bonding pad for bonding a phase delay unit; forming a first penetration hole by etching the second opposing surface of the first substrate and forming an air layer between the fixed membrane and the vibrating membrane by partially etching the oxide film and the sacrificial layer; and bonding the phase delay unit on the bonding pad. In certain embodiments, the phase delay unit may be formed by: preparing a second substrate having first and second opposing surfaces and then forming a groove by etching the second opposing surface of the second substrate; forming a plurality of second penetration holes through the groove and the first opposing surface of the second substrate; depositing a catalyst to the first opposing surface of the second substrate and the second penetration holes; and synthesizing CNT (carbon nanotubes) using the catalyst.

In certain embodiments, the forming of air intake holes may include: forming a plurality of first depressions on the first opposing surface of the sacrificial layer and a plurality of second depressions on the first opposing surface of the fixed membrane; and forming a plurality of projections on the second opposing surface of the fixed membrane, wherein the projections may be received in the first depressions of the sacrificial layer.

In certain embodiments, the depositing of the first pad, the second pad, or the bonding pad may be performed by eutectic bonding using a metal.

In certain embodiments, the catalyst may include iron (Fe).

In certain embodiments, the synthesizing of the CNT may include injecting ammonia gas (NH3) and acetylene gas (C2H2) into a quartz tube at a temperature of 700° C., using CVD (Chemical Vapor Deposition) equipment.

Another exemplary embodiment of the present invention provides a method of manufacturing a microphone, which includes: preparing a first substrate having first and second opposing surfaces and then forming a vibrating membrane having an oxide film and a plurality of slots on the first opposing surface of the first substrate; forming a sacrificial layer and a fixed membrane, each having first and second opposing surfaces, over the vibrating membrane and then forming a plurality of air intake holes through the fixed membrane; depositing a first pad to be connected with the fixed membrane, a second pad to be connected with the vibrating membrane, and a bonding pad for bonding a phase delay unit; forming a first penetration hole by etching the second opposing surface of the first substrate and forming an air layer between the fixed membrane and the vibrating membrane by partially etching the oxide film and the sacrificial layer; and bonding the phase delay unit on the bonding pad. The phase delay unit is formed by: preparing a second substrate having first and second opposing surfaces and then forming a groove by etching the second opposing surface of the second substrate; forming a plurality of second penetration holes through the groove and the first opposing surface of the second substrate; depositing zinc oxide nanoparticles to the groove, the top, and the second penetration holes of the second substrate; and growing a zinc oxide nanowire in the second substrate with the zinc oxide nanoparticles deposited, using hydrothermal synthesis.

In certain embodiments, in the depositing of zinc oxide nanoparticles, the zinc oxide nanoparticles may be dissolved in ethanol.

In certain embodiments, in the hydrothermal synthesis, an aqueous solution composed of zinc nitrate, HMTA (hexamethylenetetramine), and PEI (polyethylenimine) may be used.

Another exemplary embodiment of the present invention provides a method of manufacturing a directional MEMS microphone, which includes: preparing a first substrate having first and second opposing surfaces and then forming a vibrating membrane having an oxide film and a plurality of slots on the first opposing surface of the first substrate; forming a sacrificial layer and a fixed membrane, each having first and second opposing surfaces, over the vibrating membrane and then forming air intake holes through the fixed membrane; depositing a first pad to be connected with the fixed membrane, a second pad to be connected with the vibrating membrane, and a bonding pad for bonding a phase delay unit; forming a first penetration hole by etching the second opposing surface of the first substrate and forming an air layer between the fixed membrane and the vibrating membrane by partially etching the oxide film and the sacrificial layer; and bonding the phase delay unit on the bonding pad. The phase delay unit is formed by: preparing a second substrate having first and second opposing surfaces and then forming a groove by etching the second opposing surface of the second substrate; forming a plurality of second penetration holes through the groove and the first opposing surface of the second substrate; coating the groove, the first opposing surface, and the second penetration holes of the second substrate with a polymer; coating a portion of the polymer with a photoresist (PR); etching the polymer at portions other than the portion coated with a PR (photoresist) by patterning the PR between the groove and the second penetration holes; and removing the PR after the polymer has been etched.

In certain embodiments, the bonding pad may include a polymer-based bonding material.

In certain embodiments, the step of coating with the polymer may include spin coating or spray coating.

In certain embodiments, the polymer may include PE, PMMA, EMMAm PEEK, LCP, PDMS, Tefxel, phenolic resin, or an epoxy resin.

Another exemplary embodiment of the present invention provides a microphone including: a first substrate having one or more first penetration holes; a vibrating membrane disposed on the first substrate and covering the first penetration holes; a fixed membrane disposed at a predetermined distance over the vibration membrane and having a plurality of air intake holes; and a phase delay unit bonded by a bonding pad on the fixed membrane, having a plurality of second penetration holes connected to the one or more first penetration holes, and having a phase delay material in the second penetration holes.

In certain embodiments, the phase delay unit may include a second substrate having first and second opposing surfaces, the second opposing surface having a groove connected with the second penetration holes. CNTs (carbon nanotubes) may be formed as a phase delay material. In certain embodiments, the CNTs may be formed on the first opposing surface of the second substrate and fill the second penetration holes.

In certain embodiments, the phase delay unit may include a second substrate having first and second opposing surfaces, the second opposing surface having a groove connected with the second penetration holes. A zinc oxide nanowire may be formed as a phase delay material.

In certain embodiments, the zinc oxide nanowire may be formed on the first opposing surface of the second substrate, fills the second penetration holes, and is formed within the groove.

In certain embodiments, the phase delay unit may include a second substrate having first and second opposing surfaces, the second opposing surface having a groove connected with the second penetration holes. A polymer may be formed as a phase delay material.

In certain embodiments, the polymer may be formed on the first opposing surface of the second substrate, fills the second penetration holes, and is formed on a first portion of the groove. In certain embodiments, the first portion of the groove may be a portion closest to the first opposing surface of the second substrate.

According to an exemplary embodiment of the present invention, it is possible to reduce the size of the device using a wafer level package.

Since in certain embodiments, holes are formed in a silicon substrate and then a nano-material or a polymer is formed and bonded to a microphone to increase the phase delay effect, it is possible to ensure more precise directionality and improve productivity.

In certain embodiments, there is no need for digital processing and directionality can be achieved only by analog processing, so the cost for an ASIC can be reduced.

Effects that can be obtained or expected from exemplary embodiments of the present invention may be directly or suggestively described in the following Detailed Description.

DETAILED DESCRIPTION

Hereinafter, exemplary embodiments of the present invention will be described with reference to the accompanying drawings.

In order to make the description of the present invention clear, unrelated parts may not be shown, and the thicknesses of layers and regions may be exaggerated for clarity.

Further, when it is stated that a layer is “on” another layer or substrate, the layer may be directly on another layer or substrate or a third layer may be disposed therebetween.

Figure 1:
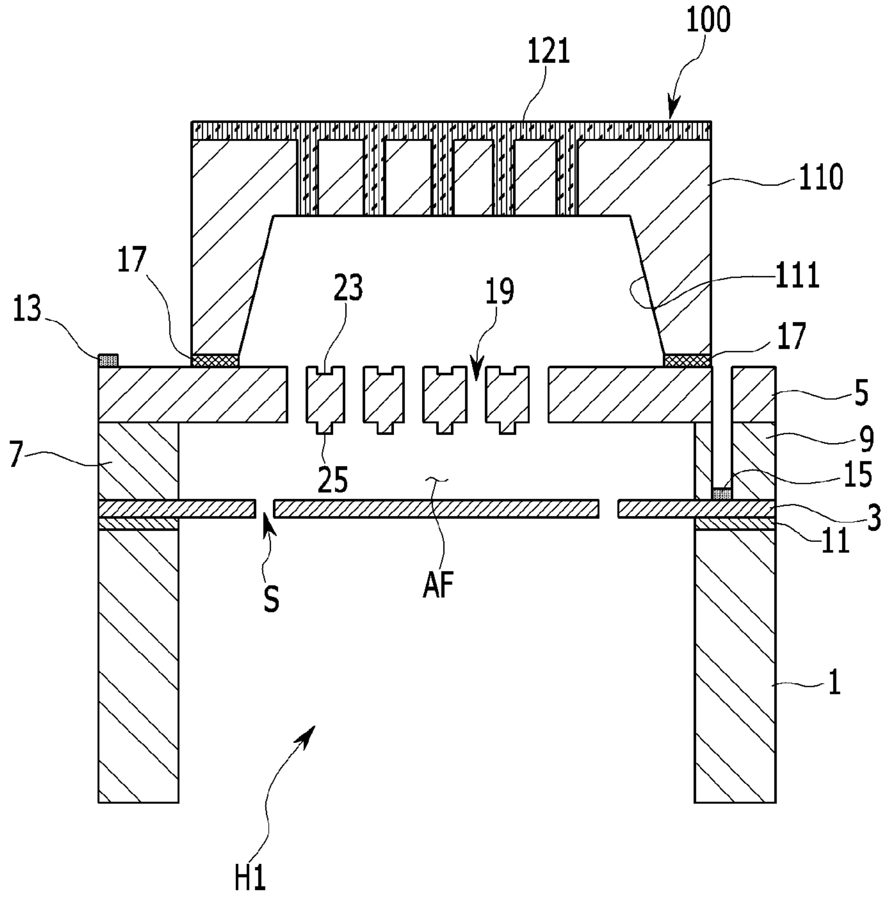
FIG. 1 is a cross-sectional view showing a microphone according to an exemplary embodiment of the present invention.

FIG. 1 is a cross-sectional view showing a microphone according to an exemplary embodiment of the present invention.

Referring to FIG. 1, a microphone according to an exemplary embodiment of the present invention includes a first substrate 1, a vibrating membrane 3, a fixed membrane 5, and a phase delay unit 100.

In certain embodiments, the first substrate 1 may be made of silicon and has first penetration hole H1.

The vibrating membrane 3 is disposed over the first substrate 1 and covers the first penetration hole H1.

In certain embodiments, the vibrating membrane 3 is partially exposed by the first penetration hole H1, and a portion of the vibrating membrane 3 exposed by the first penetration hole H1 may be vibrated by sound from the outside.

In certain embodiments, the vibrating membrane 3 may be formed in a circle and has at least one slot S.

In certain embodiments, the slot S improves the sensitivity of the microphone by reducing influence due to air damping when the vibrating membrane 3 is vibrated by sound from the outside.

The term ‘air damping’ means suppressing vibration of a vibrating membrane due to air by absorbing it.

In certain embodiments, the sensitivity of the microphone is improved by attenuating the vibration of the vibrating membrane 3 due to air, while receiving only the vibration due to sound.

In certain embodiments, the vibrating membrane 3 may be made of polysilicon, but it is not limited thereto, and may be made of any materials as long as they have conductivity.

In certain embodiments, the fixed membrane 5 is disposed under the vibrating membrane 3 and has a plurality of air intake holes 19.

In certain embodiments, the fixed membrane 5 is supported and fixed by a support layer.

In certain embodiments, the support layer 9 is disposed along the edge on the top of the vibrating membrane 5 and is a part of an etched sacrificial layer 7 to be described below.

In certain embodiments, the fixed membrane 5 has a plurality of second depressions 23 on the top and a plurality of projections 25 on the bottom.

In certain embodiments, the projections 25 protrude toward the vibrating membrane 3, and prevent contact between the vibrating membrane 3 and the fixed membrane 5, when the vibrating membrane 3 vibrates.

In certain embodiments, the fixed membrane 5 may be made of polysilicon or a metal.

In certain embodiments, an air layer AF is formed between the vibrating membrane 3 and the fixed membrane 5, so the membranes are disposed at a predetermined distance from each other.

According to this structure, sound from the outside travels inside through the air intake holes 19 of the fixed membrane 5 and hits the vibrating membrane 3, so the vibrating membrane 3 vibrates.

That is, In certain embodiments, as the vibrating membrane 3 is vibrated by sound from the outside, the gap between the vibrating membrane 3 and the fixed membrane 5 changes.

Therefore, In certain embodiments, the capacitance between the vibrating membrane 3 and the fixed membrane 5 changes and the changed capacitance is converted into an electrical signal by a signal processing circuit (not shown) through a first pad 13 connected to the fixed membrane 5 and a second pad 15 connected to the vibrating membrane 3, such that it is possible to sense sound from the outside.

In certain embodiments, the phase delay unit 100 is bonded by a bonding pad 17 on the fixed membrane 5.

In certain embodiments, the phase delay unit 100 includes a second substrate 110, and a groove 111 is formed on the bottom of the second substrate 110.

The phase delay unit 100 has a plurality of second penetration holes H2 that communicate with the groove 111.

In different embodiments, carbon nanotubes (CNT) 121, zinc oxide nanowire 131, and a polymer 140 may be deposited to the top and the groove 111 of the second substrate 110 and the second penetration hole H2 so that the phase delay unit 100 delays the phase of sound traveling inside.

A process of manufacturing the microphone is as follows.

FIGS. 2 to 5 are diagrams showing a basic method of manufacturing the microphone according to an exemplary embodiment of the present invention.

Figure 2:
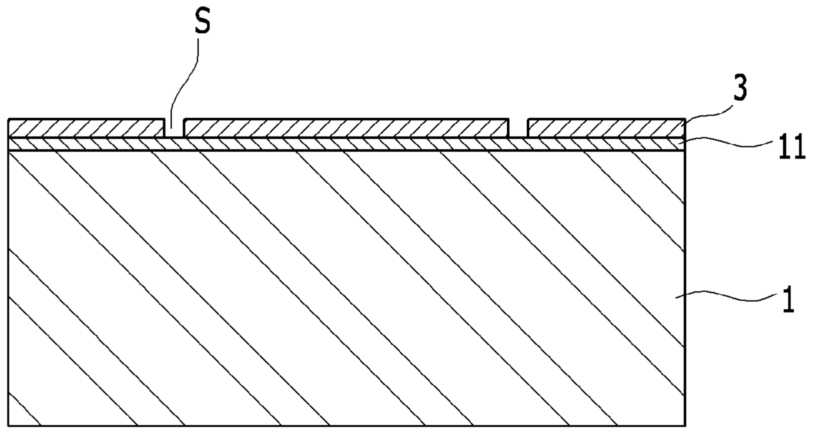
FIGS. 2 to 5 are diagrams showing a basic method of manufacturing the microphone according to an exemplary embodiment of the present invention.

Referring to FIG. 2, the first substrate 1 is prepared and then an oxide film 11 is formed on the first substrate 1.

Next, a step of forming the vibrating membrane 3 with the slots S on the oxide film 11 is performed.

In certain embodiments, the first substrate 1 may be made of silicon, and the vibrating membrane 3 may be made of polysilicon or a conductive material.

In certain embodiments, the vibrating membrane 3 with the slots S is formed by forming a polysilicon layer of a conductive material layer on the oxide film 11 and then patterning it.

In certain embodiments, the vibrating membrane 3 with the slots S is formed by forming a polysilicon layer or a conductive material layer on the oxide film 11, and then forming a photosensitive layer on the polysilicon layer or the conductive material layer.

Next, in certain embodiments, a photosensitive pattern may be formed by exposing and developing the photosensitive layer and the polysilicon layer, or the conductive material layer may be etched using the photosensitive layer pattern as a mask.

Figure 3:
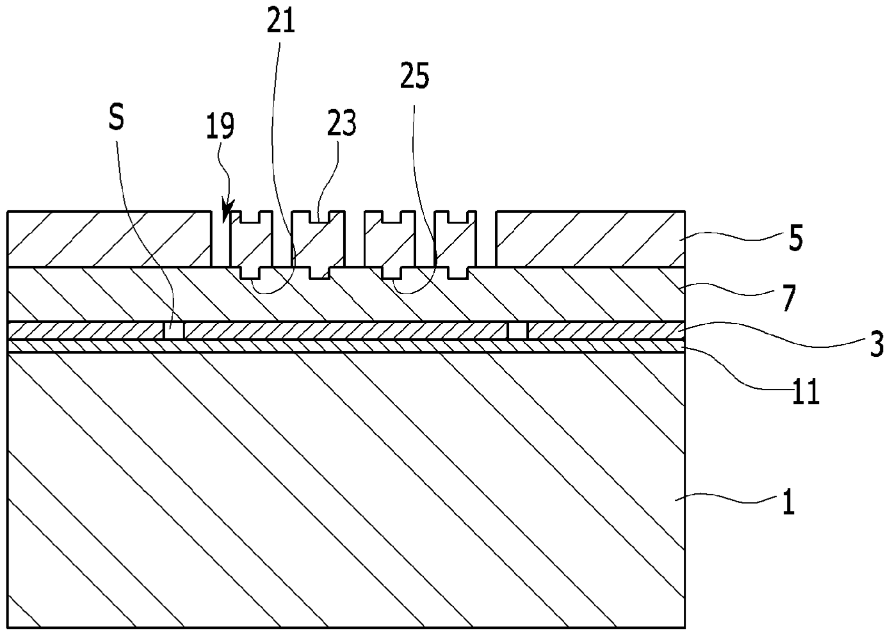

Referring to FIG. 3, the sacrificial layer 7 and the fixed membrane 5 are formed over the vibrating membrane 3.

Next, a step of forming the air intake holes 19 through the fixed membrane 5 is performed.

In certain embodiments, the sacrificial layer 7 may be made of a photosensitive substance, a silicon oxide, or a silicon nitride.

In certain embodiments, the fixed membrane 5 may be made of polysilicon or a metal.

In certain embodiments, the first depressions 21 are formed on the top of the sacrificial layer 7.

In certain embodiments, the second depressions 23 and the projections 25 are formed on the top and the bottom, respectively, of the fixed membrane 5.

In certain embodiments, the projections 25 protrude toward the vibrating membrane 3.

In certain embodiments, the sacrificial layer 7 and the fixed membrane 5 are formed such that the projections 25 are fitted into the depressions 21.

Accordingly, the projections 25 prevent contact between the vibrating membrane 3 and the fixed membrane 5, when the vibrating membrane 3 vibrates.

In certain embodiments, the air intake holes 19 may be formed by forming a photosensitive layer on the fixed membrane 5, by exposing and developing the photosensitive layer to form a photosensitive pattern, and then by etching the fixed membrane 5 using the photosensitive pattern as a mask.

Figure 4:
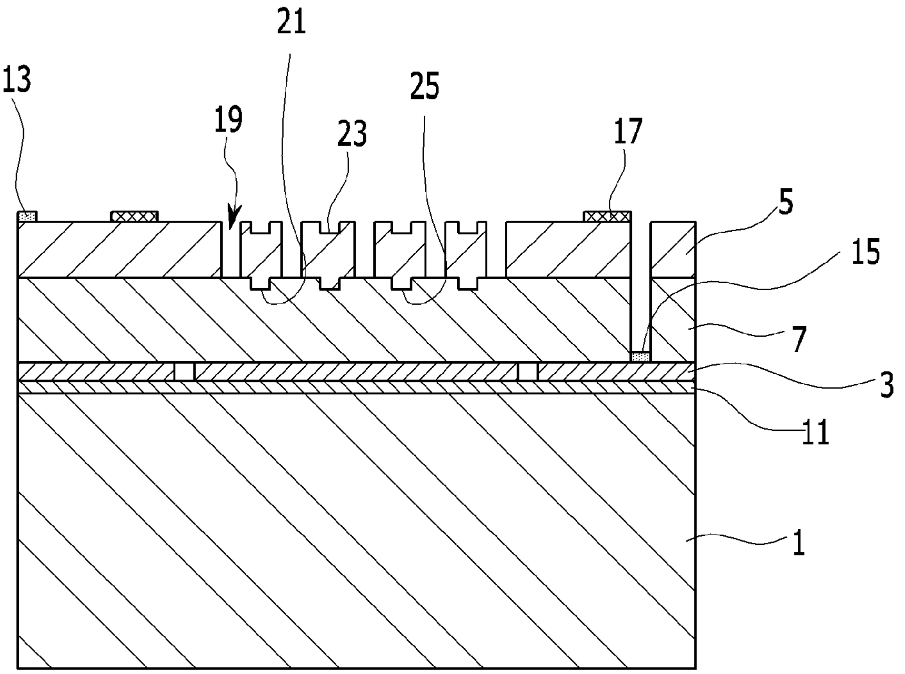

Referring to FIG. 4, a step of depositing the first pad 13 to be connected with the fixed membrane 5, the second pad 15 to be connected with the vibrating membrane 3, and the bonding pad 17 for bonding the phase delay unit 100 is performed.

In certain embodiments, the second pad 15 is formed on an exposed portion of the vibrating membrane 3, after the fixed membrane 5 and the sacrificial layer 7 are partially removed to expose the vibrating membrane 3.

In certain embodiments, the first pad 13, the second pad 15, and the bonding pad 17 may be formed in a lift-off method.

Figure 5:
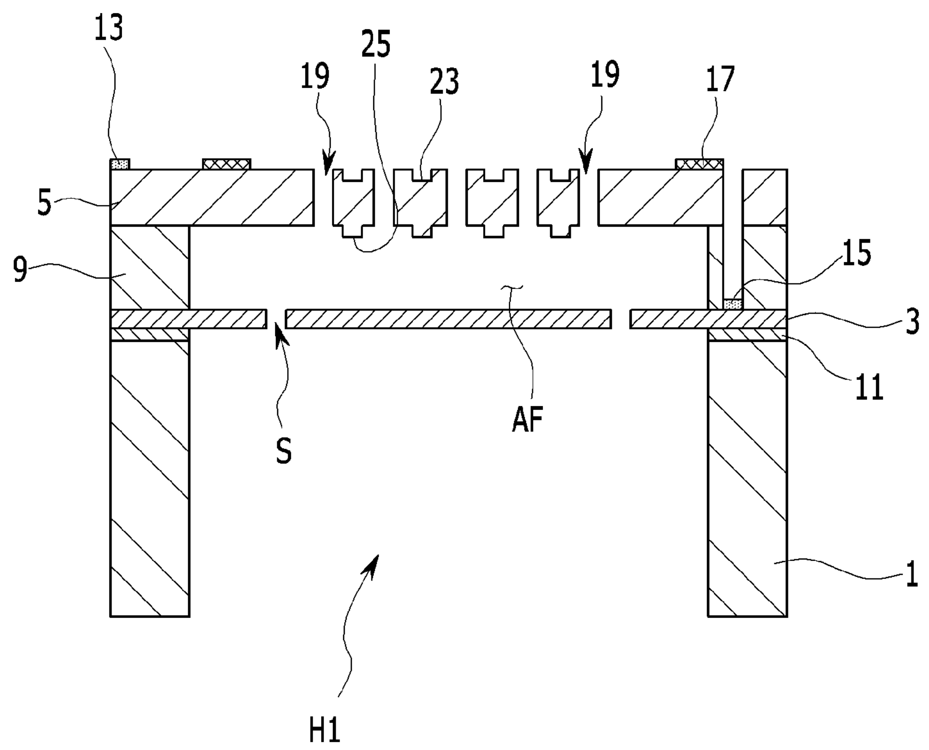

Referring to FIG. 5, a step of forming the first penetration hole H1 by etching the bottom of the first substrate 1 and of forming the air layer AF between the vibrating membrane 3 and the fixed membrane 5 by partially etching the oxide film 11 and the sacrificial layer 7 is performed.

In certain embodiments, the first penetration hole H1 may be formed by performing dry etching or wet etching on the bottom of the first substrate 1.

When the bottom of the first substrate 1 is etched, a portion of the vibrating membrane 3 is exposed by etching the oxide film 11.

In certain embodiments, the support layer 9 supporting the fixed membrane 5 is formed by etching a portion of the sacrificial layer 7.

In certain embodiments, the support layer 9 is positioned along the edge of the top of the vibrating membrane 3, and supports and fixes the fixed membrane 5.

In certain embodiments, the air layer AF may be formed by removing a portion of the sacrificial layer 7 by wet etching using an etchant through the air intake holes 19.

Further, In certain embodiments, the air layer AF may be formed by dry etching, such as ashing using oxygen plasma, through the air intake holes 19.

In certain embodiments, a portion of the sacrificial layer 7 is removed by wet etching or dry etching, thereby forming the air layer AF between the vibrating membrane 3 and the fixed membrane 5.

In certain embodiments, the remaining sacrificial layer 7 is positioned along the edge of the vibrating membrane 3, as the support layer that supports the fixed membrane 5.

Hereinafter, based on the manufacturing process, embodiments of a process of manufacturing the phase delay unit 100 to be bonded by the bonding pad 17 are described.

FIGS. 6 to 11 are diagrams showing a method of manufacturing a phase delay unit of a microphone according to an exemplary embodiment of the present invention.

Figure 6:
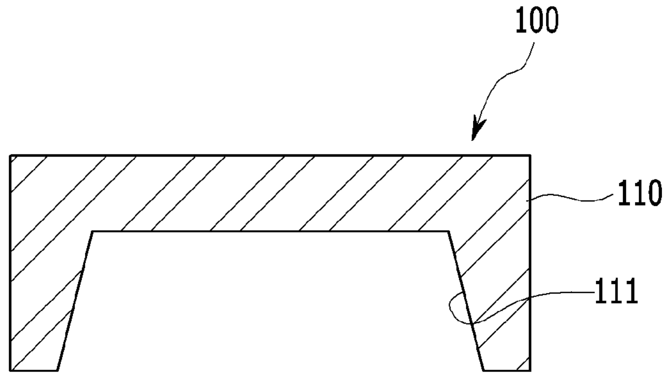
FIGS. 6 to 11 are diagrams showing a method of manufacturing a phase delay unit according to an exemplary embodiment of the present invention.

Referring to FIG. 6, after preparing the second substrate 110, a step of forming the groove 111 by etching the bottom of the second substrate 110 is performed.

In certain embodiments, the bottom may be etched by wet etching or dry etching to form the groove 111.

Figure 7:
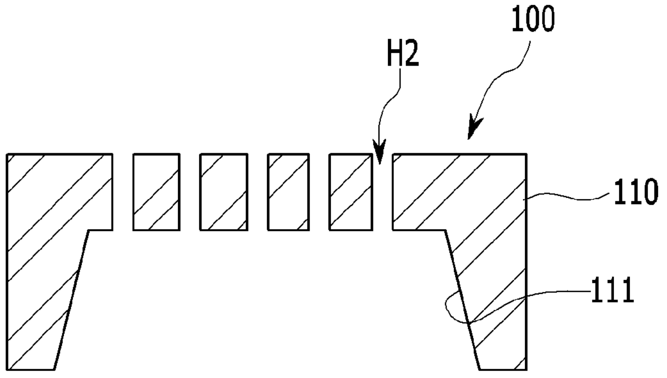

Referring to FIG. 7, a step of forming the second penetration holes H2 through the groove 111 and the front side of the second substrate 110 is performed.

In certain embodiments, the second penetration holes H2 are formed by forming a photosensitive pattern on the second substrate 110 and then etching the second substrate 110 using the photosensitive pattern as a mask.

Figure 8:
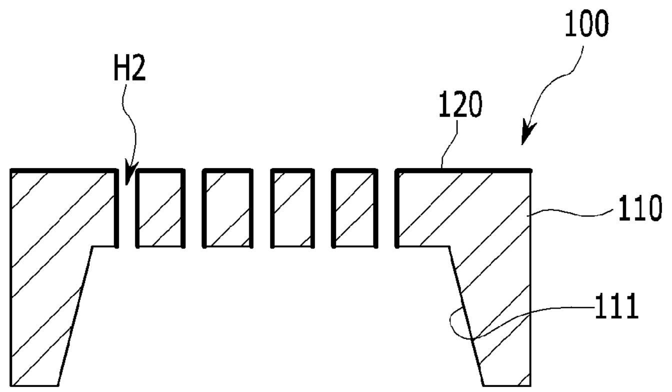

Referring to FIG. 8, a step of depositing a catalyst 120 to the second penetration holes H2 and the front side of the second substrate 110 is performed.

In certain embodiments, the catalyst 120 may be iron (Fe).

Figure 9:
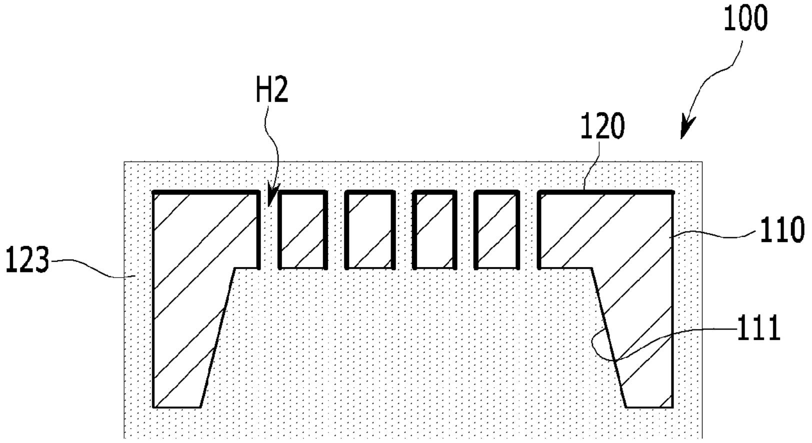
Figure 10:
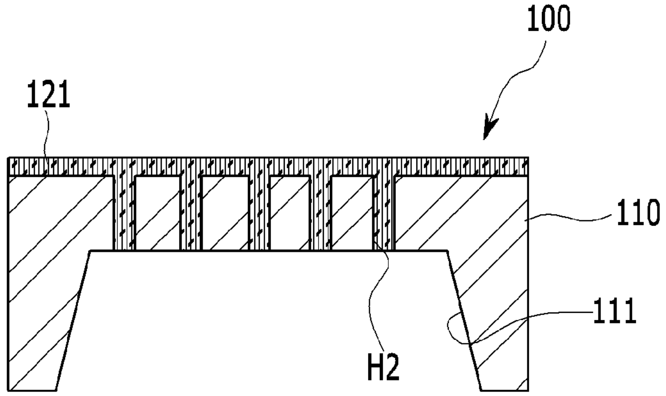

Referring to FIGS. 9 and 10, a step of synthesizing the CNT (carbon nanotubes) 121 using the catalyst 120 is performed.

In certain embodiments, CVD (Chemical Vapor Deposition) equipment 123 may be used to synthesize the CNT 121.

In certain embodiments, the CVD equipment 123 synthesize the CNT 121 by injecting ammonia NH3 gas and acetylene C2H2 gas in a quartz tube at a temperature of 700° C. and maintaining the state for a predetermined time, using chemical vapor deposition.

In certain embodiments, the synthesized CNT 121 fills the top of the second substrate 110 and the second penetration holes H2, where the catalyst 120 has been deposited.

Figure 11:
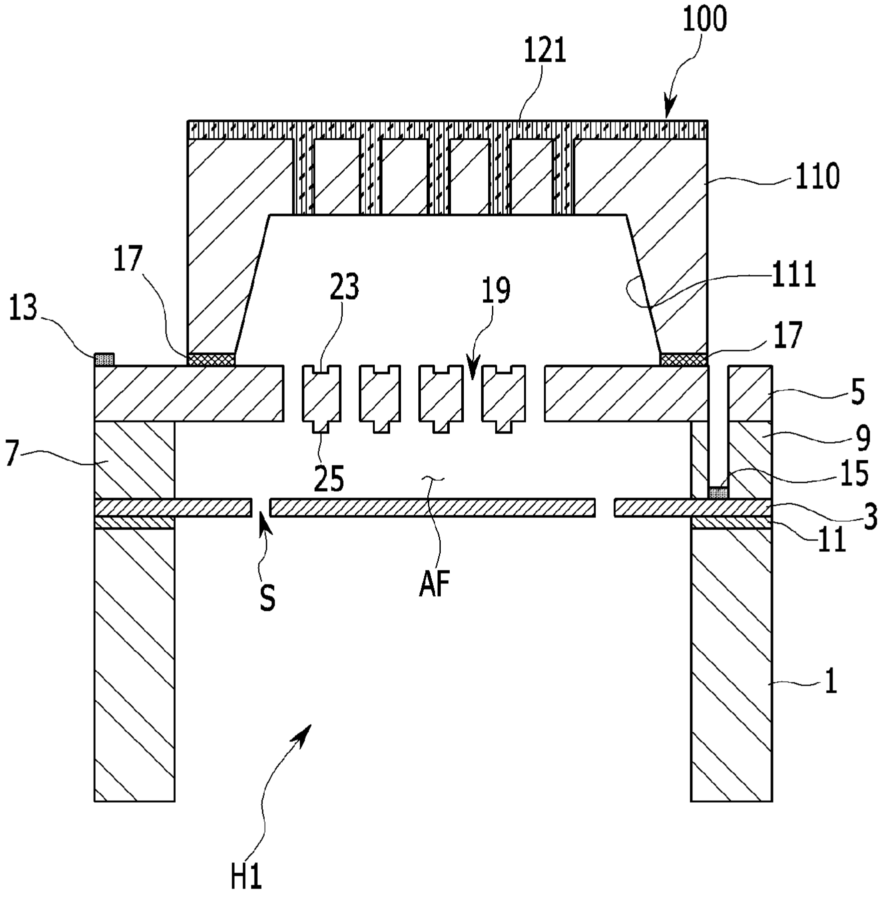

Referring to FIG. 11, a step of bonding the phase delay unit 100, which has been manufactured as described above, to the bonding pad 17 on the top of the fixed membrane 5 is performed.

In certain embodiments, the bonding pad 17 may be made of a metal and the bonding may be achieved eutectic bonding.

Eutectic bonding is a type of bonding using the phenomenon in which the components of an alloy are easily melted and bonded to each other at the lowermost melting point thereof, when predetermined conditions such as a predetermined component ratio and a predetermined temperature are satisfied.

FIGS. 12 to 15 are diagrams showing a method of manufacturing a phase delay unit of a microphone according to another exemplary embodiment of the present invention.

Figure 12:
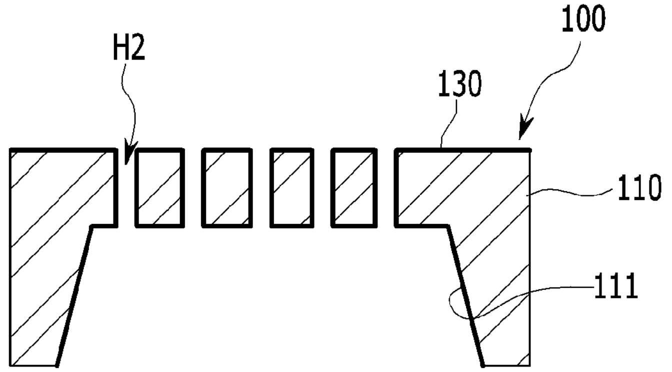
FIGS. 12 to 15 are diagrams showing a method of manufacturing a phase delay unit according to another exemplary embodiment of the present invention.

Referring to FIG. 12, in this embodiment, a step of depositing zinc oxide nanoparticles 130 to the groove 111, the second penetration holes H2, and the top of the second substrate 110 is performed on the basis of the processes shown in FIGS. 6 and 7.

In certain embodiments, the zinc oxide nanoparticles 130 are dissolved in ethanol and deposited to the groove 11, the top, and the second penetration holes H2 of the second substrate 10.

Figure 13:
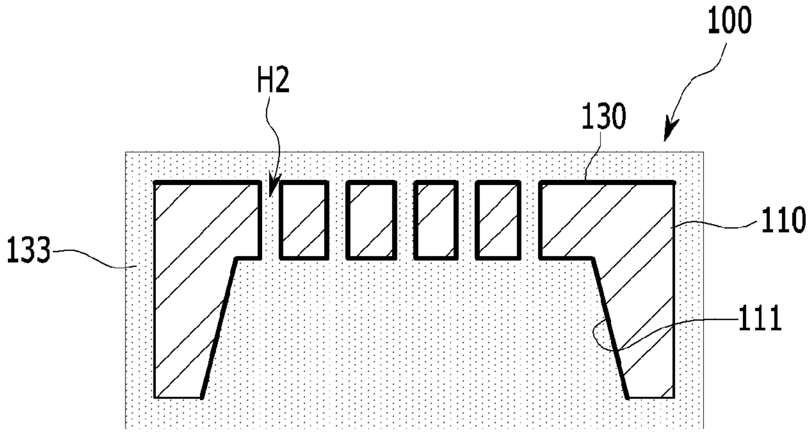
Figure 14:
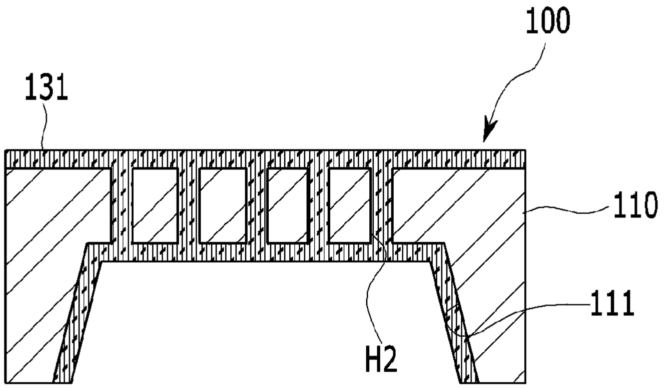

Referring to FIGS. 13 and 14, a step of growing a zinc oxide nanowire 131 in the second substrate 210 with the zinc oxide nanoparticles 130 deposited, using hydrothermal synthesis is performed.

In certain embodiments, the hydro-thermal synthesis grows the zinc oxide nanoparticles 130 into the zinc oxide nanowire 131 by putting the second substrate 110 into an aqueous solution 133 composed of zinc nitrate, HMTA (hexamethylenetetramine), and PEI (polyethyleneimine), and then using a hydrothermal reaction that is generated by applying predetermined pressure and heat for a predetermined time.

Figure 15:
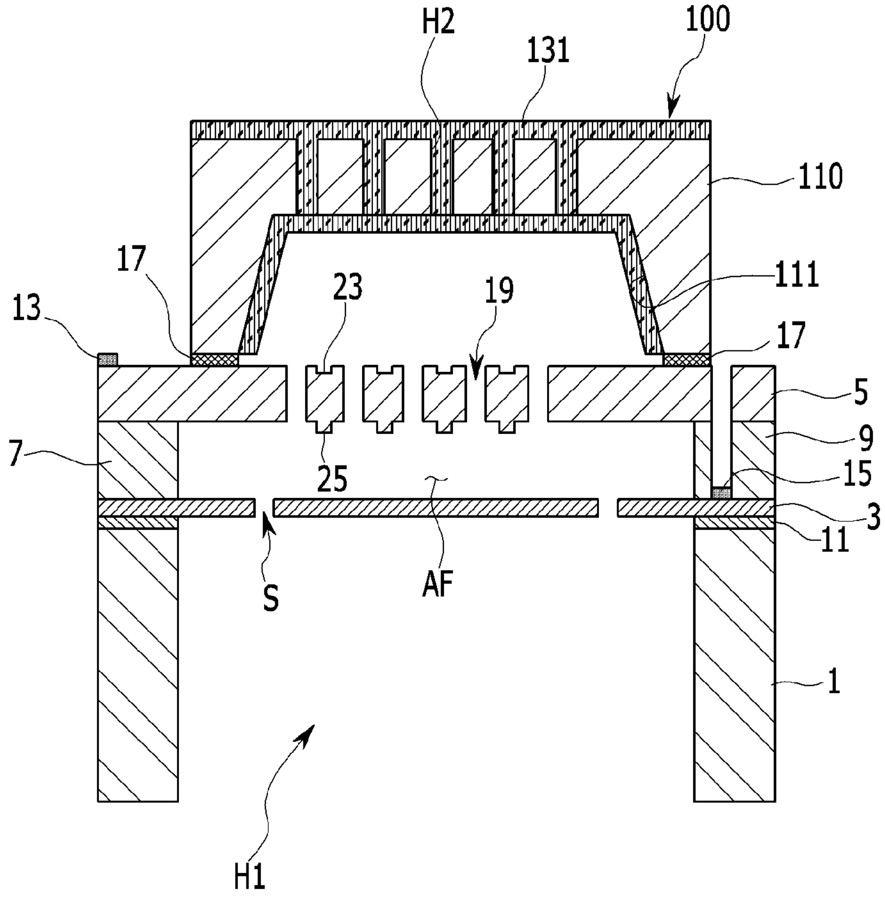

Referring to FIG. 15, a step of bonding the phase delay unit 100, which has been manufactured as described above, to the bonding pad 17 on the top of the fixed membrane 5 is performed.

In certain embodiments, the bonding pad 17 may be made of metal and the bonding may be achieved by eutectic bonding.

FIGS. 16 to 19 are diagrams showing a method of manufacturing a phase delay unit a microphone according to yet another exemplary embodiment of the present invention.

Figure 16:
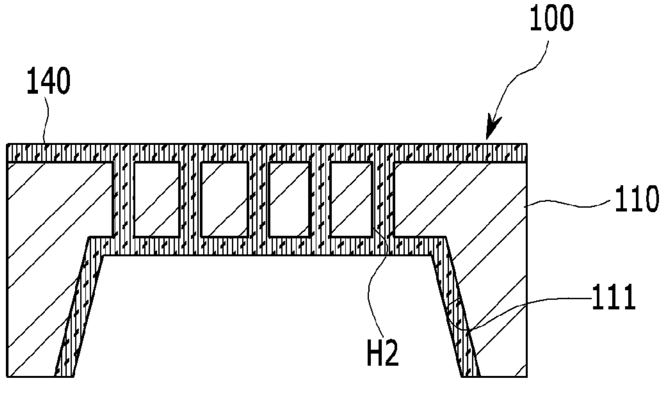
FIGS. 16 to 19 are diagrams showing a method of manufacturing a phase delay unit according to a third exemplary embodiment of the present invention.

Referring to FIG. 16, a step of coating the groove 111, the top, and the second penetration holes H2 of the second substrate 110 with a polymer 140 is performed on the basis of the processes of FIGS. 6 and 7.

In certain embodiments, the coating of a polymer 140 may be carried out by either one of spin coating and spray coating.

In certain embodiments, the polymer 140 may include PE, PMMA, EMMAm PEEK, LCP, PDMS, Tefxel, phenolic resin, and an epoxy resin, but it is not limited thereto, and may be any polymer-based material.

Figure 17:
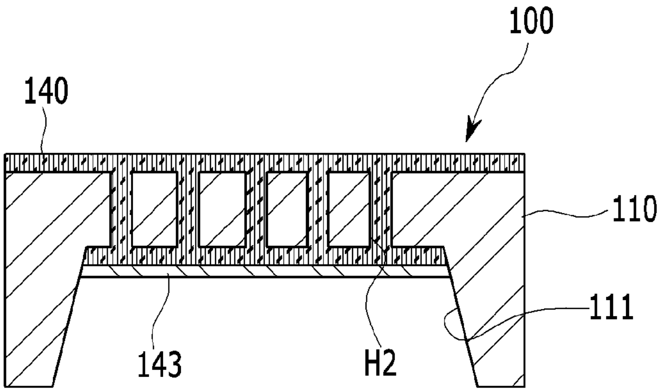

Referring to FIG. 17, a step of etching the polymer 140 at the other portions except for a portion coated with a PR (photoresist) 143 by patterning the PR 143 between the groove 111 and the second penetration holes H2 of the second substrate 110 is performed.

In certain embodiments, the PR 143 may be formed on the polymer 140 formed on the top of the groove 111 of the second substrate 110.

Figure 18:
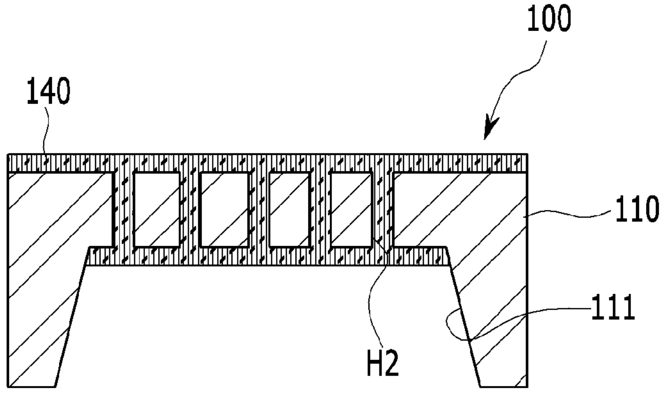

Referring to FIG. 18, a step of removing the PR 143 is performed.

Figure 19:
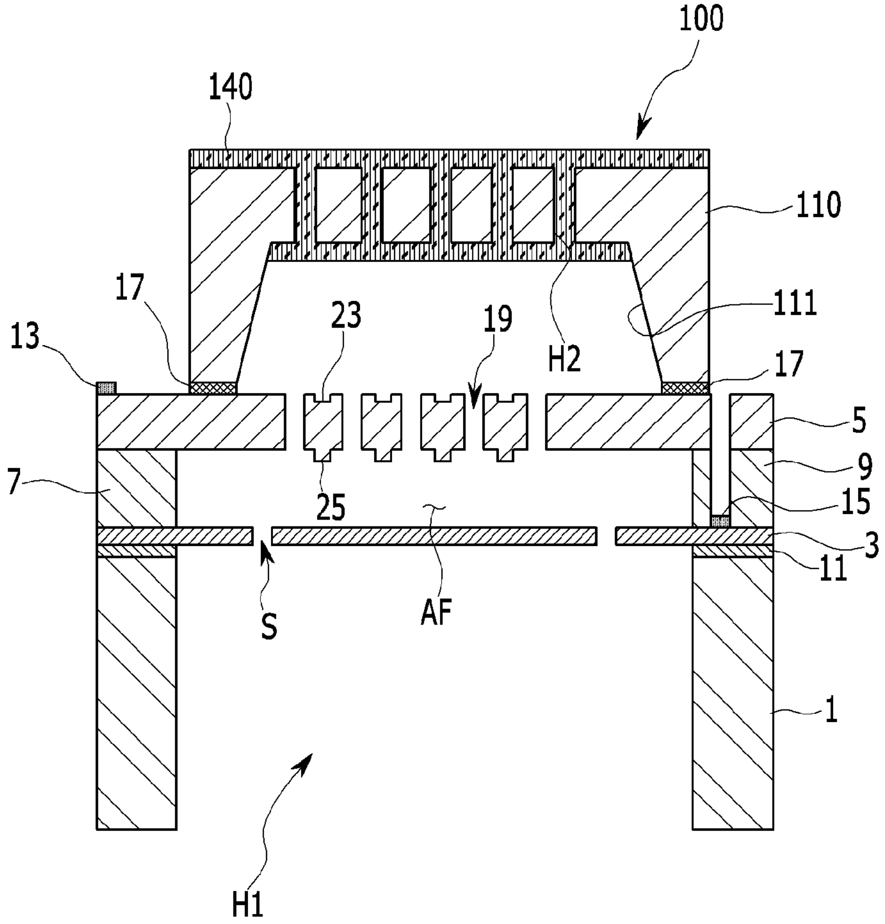

Referring to FIG. 19, a step of bonding the phase delay unit 100, which has been manufactured as described above, to the bonding pad 17 on the top of the fixed membrane 5 is performed.

In certain embodiments, the bonding pad 17 is a polymer-based bonding material and bonds the phase delay unit 100 to the fixed membrane 5.

Therefore, the phase delay unit 100 according to an exemplary embodiment of the present invention can further delay the phase of sound traveling into the microphone, by using the CNT 121, the zinc oxide nanowire 131, or the polymer 140, as compared with having only penetration holes.

While practical exemplary embodiments of the present invention have been described, it is to be understood that the invention is not limited to the disclosed embodiments, but, on the contrary, is intended to cover various modifications and equivalent arrangements included within the spirit and scope of the appended claims.

What is claimed is:

1. A method of manufacturing a microphone, comprising:

preparing a first substrate having first and second opposing surfaces and then forming a vibrating membrane having an oxide film and a plurality of slots onto the first opposing surface of the first substrate;

forming a sacrificial layer and fixed membrane, each having first and second opposing surfaces, over the vibrating membrane and then forming a plurality of air intake holes through the fixed membrane;

depositing a first pad to be connected with the fixed membrane, a second pad to be connected with the vibrating membrane, and a bonding pad for bonding a phase delay unit;

forming a first penetration hole by etching the second opposing surface of the first substrate and forming an air layer between the fixed membrane and the vibrating membrane by partially etching the oxide film and the sacrificial layer; and bonding the phase delay unit on the bonding pad, wherein the phase delay unit is formed by:

preparing a second substrate having first and second opposing surfaces and then forming a groove by etching the second opposing surface of the second substrate;

forming a plurality of second penetration holes through the groove and the first opposing surface of the second substrate;

depositing a catalyst to the first opposing surface of the second substrate and the second penetration holes; and synthesizing CNT (carbon nanotubes) using the catalyst.

2. The method of claim 1, wherein the forming of air intake holes includes:

forming a plurality of first depressions on the first opposing surface of the sacrificial layer and a plurality of second depressions on the first opposing surface of the fixed membrane; and forming a plurality of projections on the second opposing surface of the fixed membrane, wherein the projections are received in the first depressions of the sacrificial layer.

3. The method of claim 1, wherein: the depositing of the first pad, the second pad, or the bonding pad is performed by eutectic bonding using metal.

4. The method of claim 1, wherein the catalyst includes iron (Fe).

5. The method of claim 1, wherein the synthesizing of CNT includes injecting ammonia gas (NH3) and acetylene gas (C2H2) into a quartz tube at a temperature of 700° C., using CVD (Chemical Vapor Deposition) equipment.

6. A method of manufacturing a microphone, comprising:

preparing a first substrate having first and second opposing surfaces and then forming a vibrating membrane having an oxide film and a plurality of slots onto the first opposing surface of the first substrate;

forming a sacrificial layer and fixed membrane, each having first and second opposing surfaces, over the vibrating membrane and then forming a plurality of air intake holes through the fixed membrane;

depositing a first pad to be connected with the fixed membrane, a second pad to be connected with the vibrating membrane, and a bonding pad for bonding a phase delay unit;

forming a first penetration hole by etching the second opposing surface of the first substrate and forming an air layer between the fixed membrane and the vibrating membrane by partially etching the oxide film and the sacrificial layer; and bonding the phase delay unit on the bonding pad, wherein the phase delay unit is formed by:

preparing a second substrate having first and second opposing surfaces and then forming a groove by etching the second opposing surface of the second substrate;

forming a plurality of second penetration holes through the groove and the first opposing surface of the second substrate;

depositing zinc oxide nanoparticles to the groove, the top, and the second penetration holes of the second substrate; and growing a zinc oxide nanowire in the second substrate with the zinc oxide nanoparticles deposited, using hydrothermal synthesis.

7. The method of claim 6, wherein in the depositing of zinc oxide nanoparticles, the zinc oxide nanoparticles are dissolved in ethanol.

8. The method of claim 6, wherein in the hydrothermal synthesis, an aqueous solution composed of zinc nitrate, HMTA (hexamethylenetetramine), and PEI (polyethylenimine) is used.

9. A method of manufacturing a directional MEMS microphone, comprising:

preparing a first substrate having first and second opposing surfaces and then forming a vibrating membrane having an oxide film and a plurality of slots onto the first opposing surface of the first substrate;

forming a sacrificial layer and a fixed membrane, each having first and second opposing surfaces, over the vibrating membrane, and then forming air intake holes through the fixed membrane;

depositing a first pad to be connected with the fixed membrane, a second pad to be connected with the vibrating membrane, and a bonding pad for bonding a phase delay unit;

forming a first penetration hole by etching the second opposing surface of the first substrate and forming an air layer between the fixed membrane and the vibrating membrane by partially etching the oxide film and the sacrificial layer; and bonding the phase delay unit on the bonding pad, wherein the phase delay unit is formed by:

preparing a second substrate having first and second opposing surfaces and then forming a groove by etching the second opposing surface of the second substrate;

forming a plurality of second penetration holes through the groove and the first opposing surface of the second substrate;

coating the groove, the first opposing surface, and the second penetration holes of the second substrate with a polymer;

coating a portion of the polymer with a photoresist (PR);

etching the polymer at portions other than the portion coated with a PR by patterning the PR between the groove and the second penetration holes; and removing the PR after the polymer has been etched.

10. The method of claim 9, wherein the bonding pad includes a polymer-based bonding material.

11. The method of claim 9, wherein the step of coating with the polymer includes spin coating or spray coating.

12. The method of claim 9, wherein the polymer includes PE, PMMA, EMMAm PEEK, LCP, PDMS, Tefxel, a phenolic resin, or an epoxy resin.

13. A microphone comprising:

a first substrate having one or more first penetration holes;

a vibrating membrane disposed on the first substrate and covering the first penetration holes;

a fixed membrane disposed at a predetermined distance over the vibration membrane and having a plurality of air intake holes; and a phase delay unit bonded by a bonding pad on the fixed membrane, having a plurality of second penetration holes connected to the one or more first penetration holes, and having a phase delay material in the second penetration holes.

14. The microphone of claim 13, wherein the phase delay unit includes a second substrate having first and second opposing surfaces, the second opposing surface having a groove connected with the second penetration holes, and wherein CNTs (carbon nanotubes) are formed as a phase delay material.

15. The microphone of claim 14, wherein the CNTs are formed on the first opposing surface of the second substrate and fill the second penetration holes.

16. The microphone of claim 13, wherein the phase delay unit includes a second substrate having first and second opposing surfaces, the second opposing surface having a groove connected with the second penetration holes, and wherein a zinc oxide nanowire is formed as a phase delay material.

17. The microphone of claim 16, wherein the zinc oxide nanowire is formed on the first opposing surface of the second substrate, fills the second penetration holes, and is formed within the groove.

18. The microphone of claim 13, wherein the phase delay unit includes a second substrate having first and second opposing surfaces, the second opposing surface having a groove connected with the second penetration holes, and wherein a polymer is formed as a phase delay material.

19. The microphone of claim 18, wherein the polymer is formed on the first opposing surface of the second substrate, fills the second penetration holes, and is formed a first portion of the groove.

20. The microphone of claim 19, wherein the first portion of the groove is a portion closest to the first opposing surface of the second substrate.

* * * * *